United States Patent [19]
Parker

[11] Patent Number: 4,462,114
[45] Date of Patent: Jul. 24, 1984

[54] SIGNUM SIGNAL GENERATOR

[75] Inventor: Norman W. Parker, Wheaton, Ill.

[73] Assignee: Motorola, Inc., Schaumburg, Ill.

[21] Appl. No.: 431,425

[22] Filed: Sep. 30, 1982

Related U.S. Application Data

[62] Division of Ser. No. 165,474, Jul. 2, 1980.

[51] Int. Cl.³ .................. H03B 25/00; H04B 1/62
[52] U.S. Cl. .................. 455/203; 455/214; 364/725; 329/124
[58] Field of Search .................. 455/47, 46, 109, 202, 455/203, 204, 214; 364/725, 726, 727; 329/122, 124, 125, 135

[56] References Cited
U.S. PATENT DOCUMENTS

| | | | |
|---|---|---|---|
| 3,430,151 | 2/1969 | Badessa | 455/203 |
| 3,746,996 | 7/1973 | Peoples | 455/47 |
| 3,800,131 | 3/1974 | White | 455/47 |
| 3,984,778 | 10/1976 | Bhopale | 455/202 |
| 4,019,140 | 4/1977 | Swerdlow | 455/47 |
| 4,397,039 | 8/1983 | McAuliffe | 455/203 |

Primary Examiner—Tommy P. Chin
Attorney, Agent, or Firm—Margaret M. Parker; James S. Pristelski; James W. Gillman

[57] ABSTRACT

A single carrier is amplitude-modulated by a signal which is a transform (as the sine function) of the audio signal, and one set of sidebands is removed. In a receiver, the signal can be recovered by first deriving the Hilbert transform of the sine transform, and multiplying it by the signum of the derivative of the original audio signal to obtain the cosine transform. The sine and cosine transforms are then decoded to obtain the original audio signal. A circuit for deriving the signum of the derivative of a signal is disclosed.

6 Claims, 14 Drawing Figures

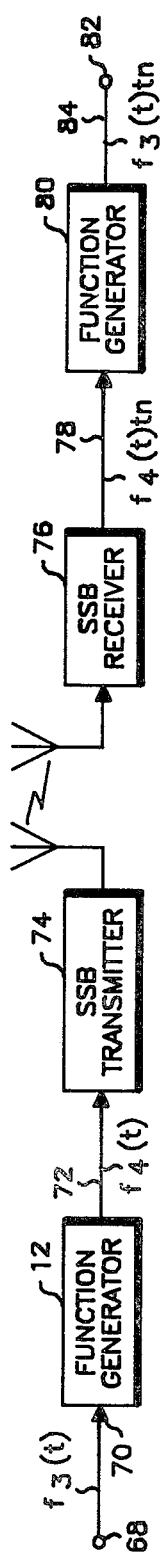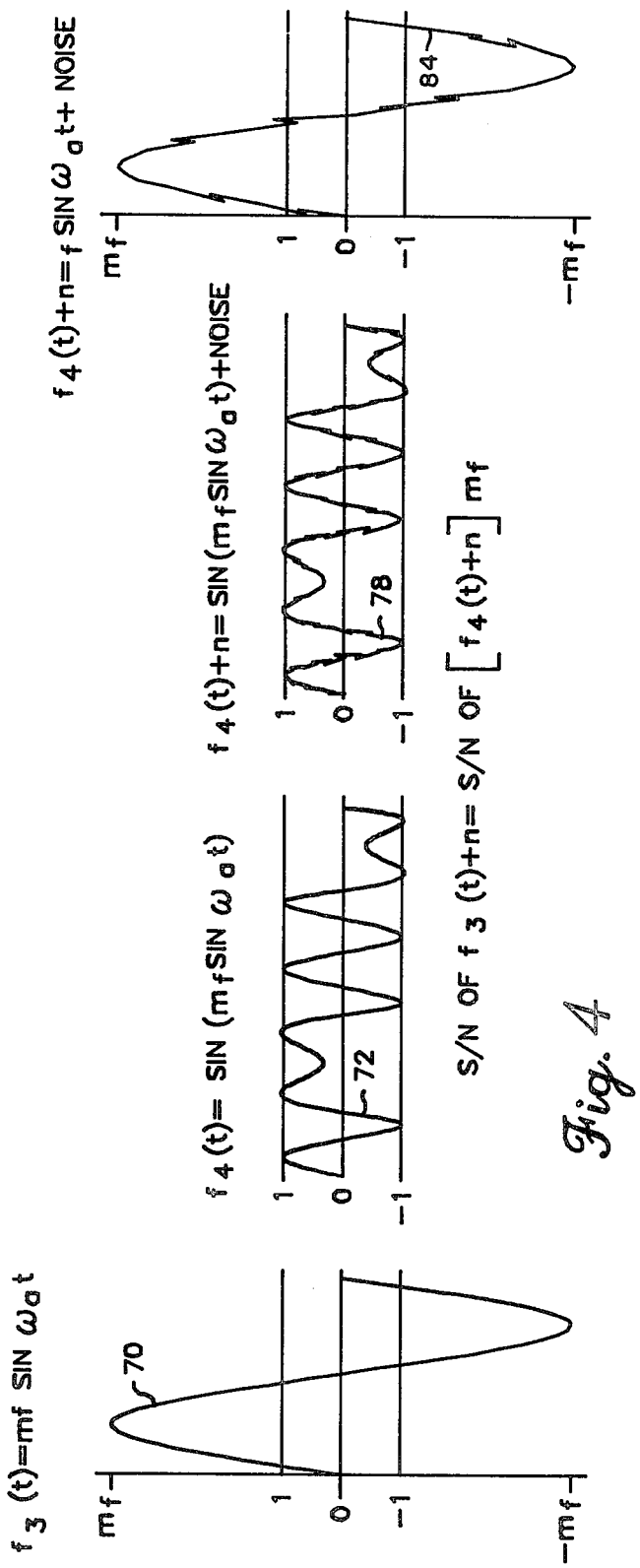
Fig. 4

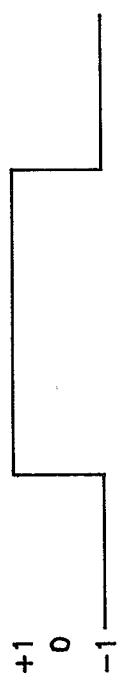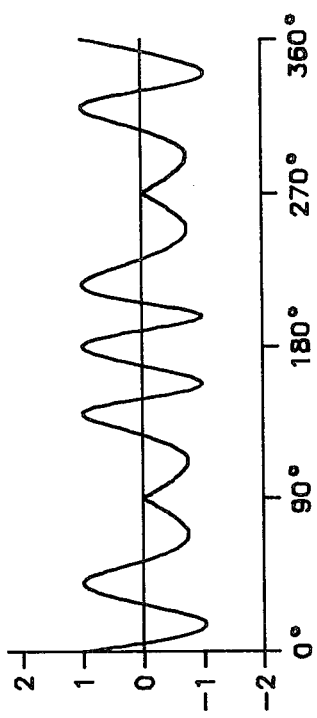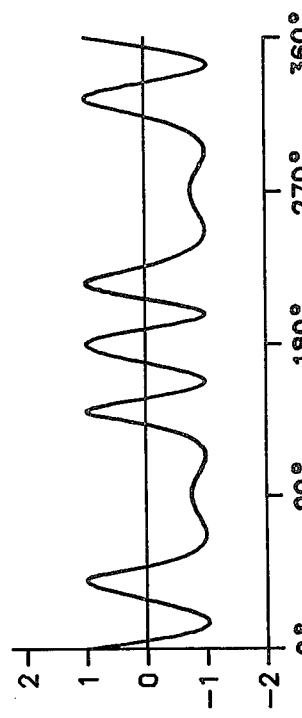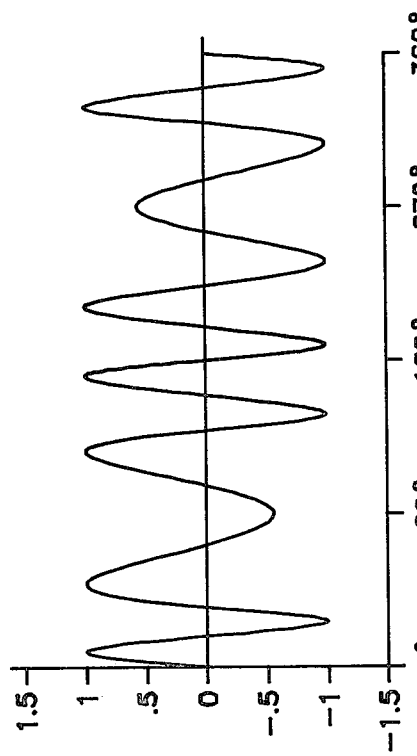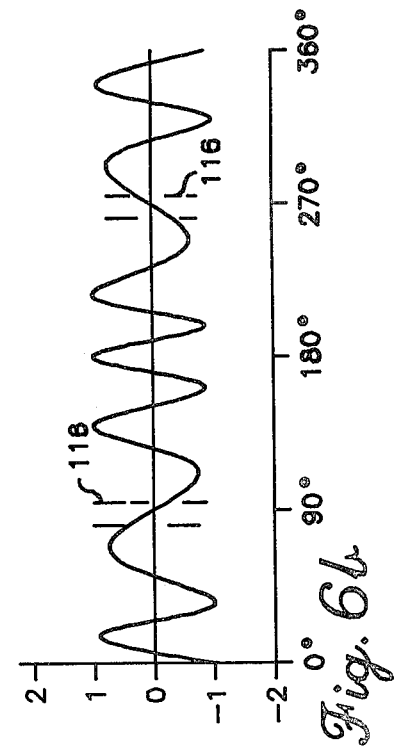

SIGNUM SIGNAL GENERATOR

This is a division of application Ser. No. 165,474, filed July 2, 1980.

BACKGROUND OF THE INVENTION

This invention relates to the field of radio transmissions systems providing all of the advantages of present FM systems within one-half the normal bandwidth and, more particularly, to a circuit for providing a signum signal for use in such system.

It is well known that angular modulation systems have advantages over amplitude modulation systems, notably in the areas of signal-to-noise ratio and in the ability to "capture" a receiver. However, due to the steadily increasing demand for more communication channels throughout the radio spectrum, the smaller band width required by AM-SSB systems has begun to appear more desirable in spite of the considerable disadvantages. Thus, there has developed a need for a system having the advantages of FM within the bandwidth of the AM-SSB system.

Known angular modulation systems are of two main types. One system uses direct frequency modulation of an oscillator which could not be a stable oscillator such as a crystal oscillator except with a very low modulation index. The usual phase modulated system uses a stable oscillator with narrow band modulation, then multiplies the frequency of the modulated signal to obtain the desired broadband signal.

SUMMARY OF THE INVENTION

It is therefore an object of the present invention to provide a transmission system having the advantages of FM transmission and approximately one-half the bandwidth.

Another object is to provide an improved system of FM transmission.

A more particular object is to provide a means of deriving the signum function signal as for use in such a transmission system.

These objects and others which will become apparent are obtained in a system wherein the modulating signal is one of the transform signals of an FM system, with one set of sidebands removed. The second transform signal can be recovered at the receiver to provide the original input signal.

The signum function signal is provided by a circuit having one input of sin f(t) and one input of the Hilbert transform of sin f(t). The circuit detects the zero crossings in the Hilbert transform which essentially coincide with the zero crossings of the derivative of sin f(t) and reverses the phase of the Hilbert transform signal at each coincidence for use in recovering the non-transmitted transform signal.

BRIEF DESCRIPTION OF THE DRAWING

FIG. 4 is a block diagram of the transform modulation system with waveforms.

FIGS. 6A to 6E are charts of waveforms related to FIGS. 5 and 8.

DETAILED DESCRIPTION OF THE PREFERRED EMBODIMENTS

Background Theory

Figure 1:
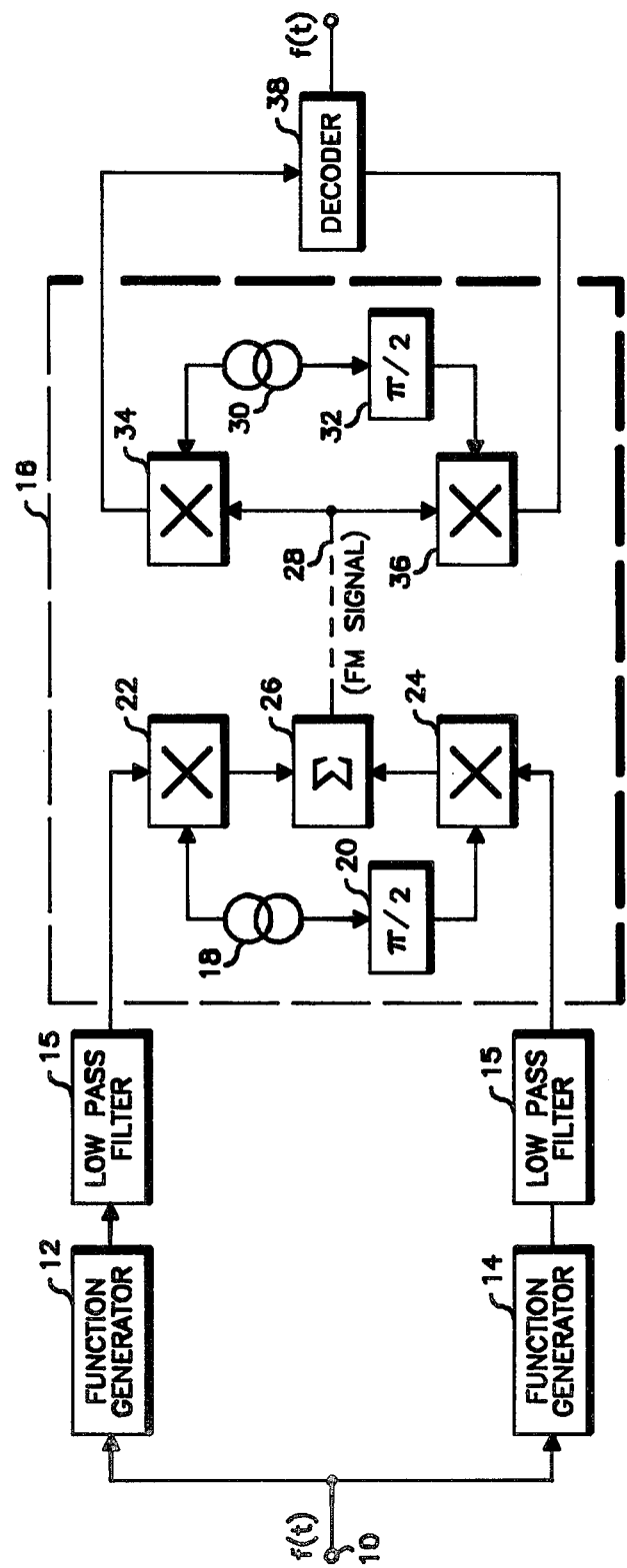
FIG. 1 is a block diagram of an FM system.

In order to facilitate a better understanding of the specific embodiments of the present invention, it may be preferable to begin by discussing the existing systems of modulation as used with analog signals. These fall into two basic categories, each with its own advantages and disadvantages. Amplitude modulation as used in standard broadcasting, is a double sideband signals (AM-DSB) system including the carrier frequency and requires a bandwidth double the audio bandwidth since there is a sideband on each side of the carrier frequency for each frequency in the modulating signal. Suppressing the carrier frequency (AM-DSB-SC) improves the signal-to-noise ratio by as much as 6 dB. Single sideband AM transmission, as used for other than the broadcast band, reduces the required bandwidth by half, is typically used with a suppressed carrier (AM-SSB-SC), and the signal-to-noise ratio is better than with AM-DSB or AM-DSB-SC. The second basic method of modulation is angular modulation which may be either frequency (FM) or phase (PM) modulation. In angular modulation, only the frequency (or phase) of the carrier frequency is varied by the modulating signal. The required bandwidth depends on the modulating index and, for normal broadcasting, is at least ten times the audio bandwidth which provides a significant improvement in signal-to-noise ratio. This may be termed wideband FM, usually referred to merely as FM. In narrowband FM (FM-NB) the modulating index may be as low as 1.0, making the bandwidth approximately the same as for AM-DSB, but the signal-to-noise ratio is still greater than for any form of AM, assuming that both AM and FM use pre-emphasis and de-emphasis.

In transform modulation (TM) the advantages of both AM and FM are combined; i.e., for any given transmission bandwidth, the signal-to-noise ratio will be considerably greater with TM than with any form of AM or FM (PM) and the "capture" characteristic of FM is retained. This can best be seen by first recognizing that an FM signal can be represented by either:

$$a = A_c \sin [\omega_c t + m_f \sin \omega_a t] \quad (1)$$

where $A_c$ is the carrier amplitude, $\omega_a$ is $2\pi f_a$, the audio frequency, and $m_f$ is $\Delta F/f_a$ where $\Delta F$ is the peak frequency deviation, or by $$a = A_c\{[\cos (m_f \sin \omega_a t)] \sin \omega_c t + [\sin (m_f \sin \omega_a t)] \cos \omega_c t\} \quad (2)$$

Equation 2 is thus seen to be a form of double sideband, suppressed carrier, quadrature modulated AM system with both sidebands required for coherent decoding of the original input signal. In distinction to known AM quadrature signals, however, each of the modulating signals, $\cos (m_f \sin \omega_a t)$ and $\sin (m_f \sin \omega_a t)$ is a "transform" of the original audio signal multiplied by the modulation index. Thus, each of the modulating signals has a limited peak magnitude, limited by the maximum values of the sine and cosine. This amounts to "folding" each signal back upon itself. It is this folding process which provides both the capture characteristic and the higher signal-to-noise ratio of FM since, when the signal is "unfolded" the level of any noise introduced during transmission remains unchanged.

In order to provide an ideal signal it is necessary to determine what function of the original signal, when used to modulate the carrier single sideband, would allow coherent decoding at a receiver. Such a function must have the following characteristics: It must somehow "fold" the signal back upon itself in order to maintain a constant peak amplitude of the carrier; it must do the "folding" in a manner which produces the minimum number of sidebands (narrowest possible bandwidth); and, of course, it must be a function which is possible to obtain and to decode.

As will become apparent, the ideal way to obtain such a function is to transform the signal $m_f \sin \omega_a t$ to sin $(m_f \sin \omega_a t)$ which has a constant peak amplitude for values of $m_f$ greater than $\pi/2$. When a single carrier is amplitude modulated with this transform signal (herein termed "TM" for "transform modulation"), and one set of sidebands is removed before transmission, the signal-to-noise ratio of the received signal is the same as an FM signal which the same modulation index (and twice the bandwidth) and better than an AM signal of the same bandwidth.

FIG. 1 illustrates how an understanding of the equation (2) as given above can be used to provide a new transmission system for standard FM. A signal f(t) is coupled from a terminal 10 to two function generators 12, 14, which provide the complementary functions $f_1(t)$ and $f_2(t)$ which are sin f(t) and cos f(t) which will be referred to hereinbelow. The signals from function generators 12, 14 may be coupled through lowpass filters 15 which would pass all frequencies necessary to allow recovery of sin f(t) and cos f(t) with satisfactory accuracy. These signals are coupled as inputs to a form of AM quadrature system 16 (shown in dashed line) and are, within the limits of the transmission system, the output signals of the system 16. The system 16 includes an encoding or modulation portion having a frequency source 18 for providing sin $\omega_c t$, a phase shifter 20 for producing a quadrature signal cos $\omega_c t$, a multiplier 22 coupled to function generator 12 and frequency source 18, a multiplier 24 coupled to function generator 14 and phase shifter 20, and an adder 26 coupled to combine the outputs of multipliers 22, 24. The adder output is connected by a link 28 to a demodulation portion of the system 16 which may contain a frequency source 30, a phase shifter 32, a multiplier 34 coupled to the link 28 and source 30, a multiplier 36 coupled to the link 28 and the phase shifter 32. The frequency source 30 may be synchronized with the frequency source 18. It will be seen that the outputs of the multipliers 34, 36, are essentially $f_1(t)$ and $f_2(t)$. The FM signal in the link 28 can be an RF signal which may amplified, translated in frequency and transmitted, thus the link 28 may be merely one wire or a complete transmitting/receiving system.

Keeping in mind that the modulating signals were not simply f(t), the input signal at terminal 10, but the sine and cosine functions of f(t), it will be seen that the signal at the link 28 is the signal of Equation 2 above, a constant amplitude, frequency-modulated signal. A decoder 38 receives the two signals sin f(t) and cos f(t) and derives f(t). It will, of course, be understood that the link 28 could couple to any other form of standard FM receiver.

Figure 2A:
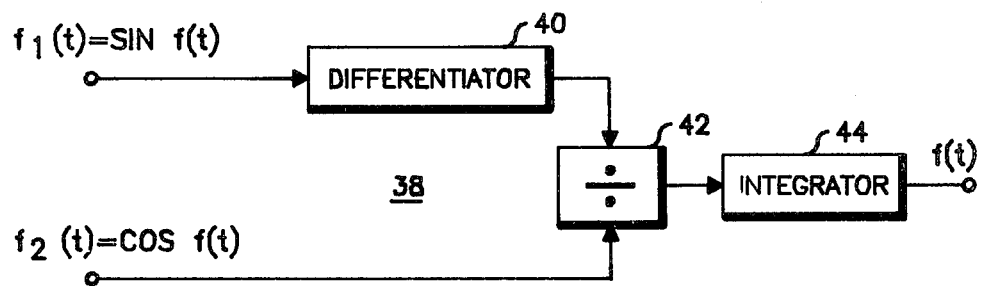
FIGS. 2A, B and C are block diagrams of three embodiments of the decoder of FIG. 1.

FIGS. 2A, B and C are possible embodiments of the decoder 38 of FIG. 1. In FIG. 2A, the $f_1(t)$ signal is coupled to a differentiating circuit 40 with output signal [(df(t)/dt)] cos f(t) coupled to a divider 42. In the divider, this signal is divided by cos f(t) and the output is coupled to an integrator 44 with output signal f(t) which is the original input at terminal 10 of FIG. 1.

Figure 2B:
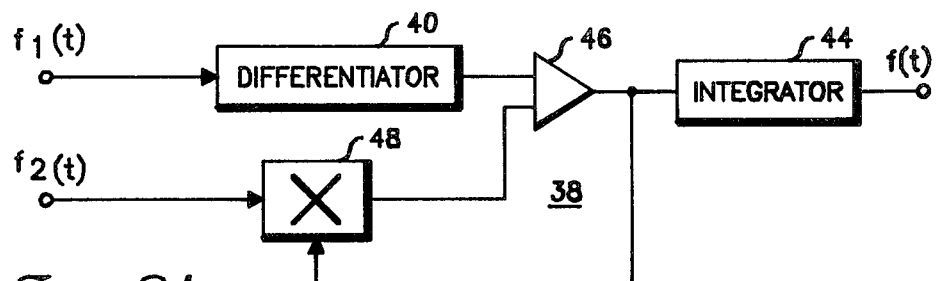

In FIG. 2B, the output of the differentiator 40 is coupled to one input of an op amp 46, which functions as a comparator, the output of which is coupled to the integrator 44. The output of the op amp 46 is also coupled back to a multiplier 48. The second input of the multiplier 48 is the input signal $f_2(t)$, and the feedback forces the output of the multiplier, coupled to the op amps, to equal the differentiator output. Thus, the input and output signals of the integrator 44 are as in FIG. 2A.

Figure 2C:
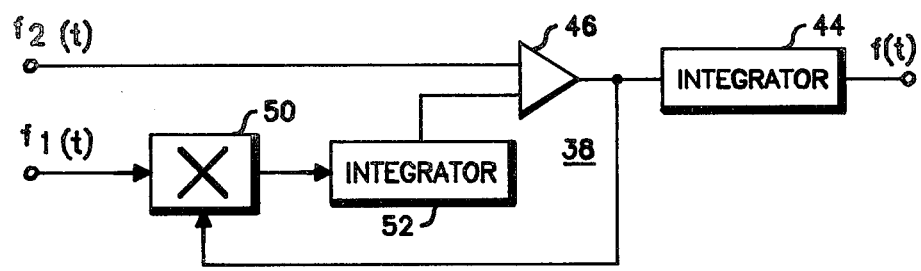

In FIG. 2C, $f_2(t)$ is coupled to the op amp 46, and the amplifier output is coupled back to a multiplier 50. The signal $f_1(t)$ is coupled to a second input of multiplier 50, and the output is coupled to another integrator 52. The integrator 52 output is thus forced to be $f_2(t)$ and is coupled to the op amp 46 and again the integrator 44 functions as above.

Figure 3:
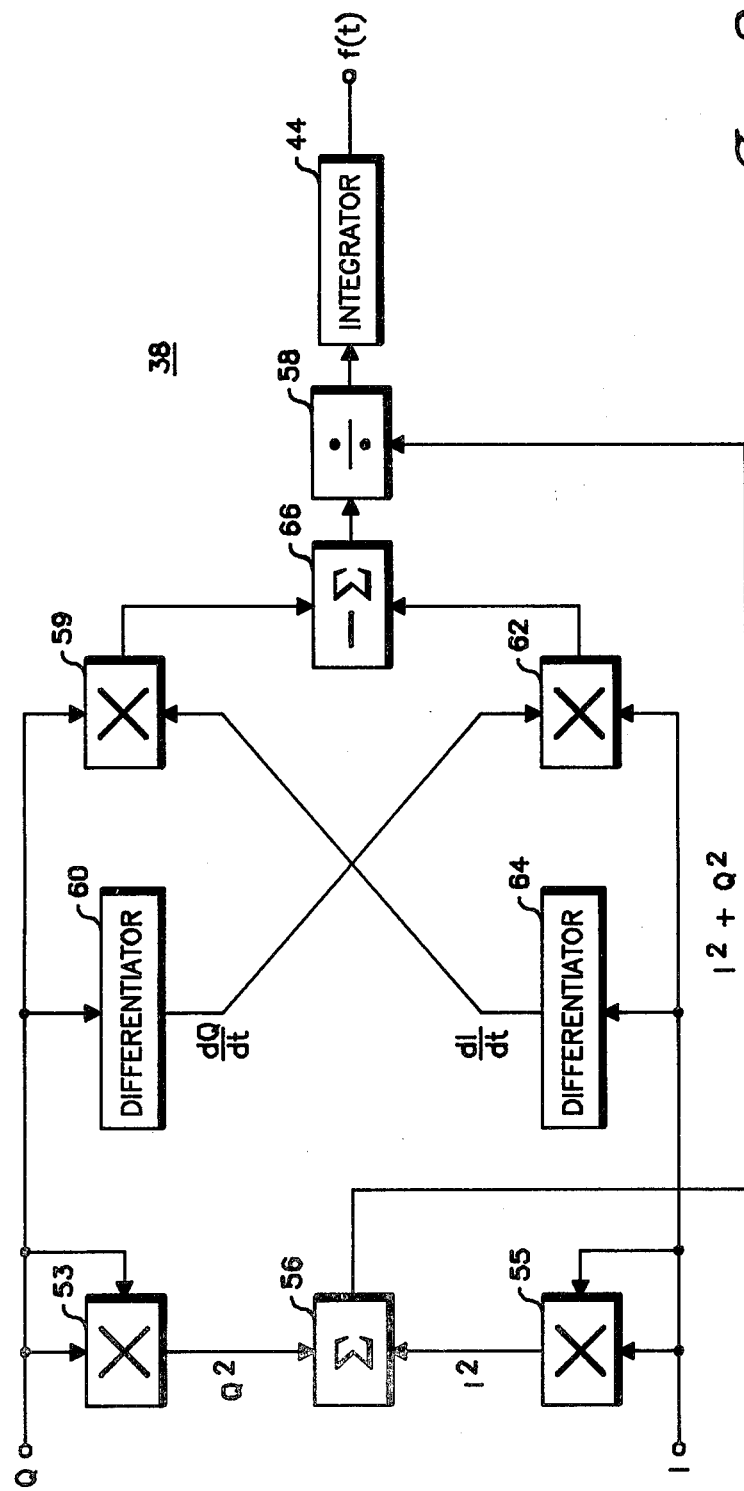
FIG. 3 is a block diagram of still another embodiment of the decoder of FIG. 1.

In FIG. 3, sin f(t)+any extraneous noise is represented by "Q" and cos f(t)+noise by "I" for simplicity in the drawing figure. As is known, the frequency modulation on the carrier is the rate of change of carrier phase angle $\phi$ or $$\frac{d\phi}{dt} = \frac{I\frac{dQ}{dt} - Q\frac{dI}{dt}}{Q^2 + I^2}$$

Deriving this rate-of-change signal usually requires a limiter/discriminator combination. To implement the derivation of the modulation signal f(t), the signal Q is squared in a multiplier 53 and signal I is squared in a multiplier 55. Signals $I^2$ and $Q^2$ are summed in an adder 56 and the sum is coupled to a divider 58. Signal Q is also coupled to a multiplier 59 and to a differentiator 60, the output of the latter being coupled to a multiplier 62. Signal I is also coupled to the multiplier 62 and to a differentiator 64, the output of the latter being coupled to the multiplier 59. The output signals of multipliers 59 and 62 are coupled to a subtractor 66 and the subtractor output signal is thus $$I\frac{dQ}{dt} - Q\frac{dI}{dt}$$

It will be seen that the combination of multipliers 59, 62, differentiators 60, 64 and subtractor 66 performs the discriminator function. This signal is coupled to the divider 58 having an output of $d\phi/dt$ and the integral of that signal, from the integrator 44, is f(t), the original signal. It will be seen that the decoder of FIG. 3 detects only frequency (or phase) modulation and ignores amplitude variations in the signal caused by noise or interference and has all the characteristics of other FM systems.

FIG. 4 illustrates a system (TM) providing the S/N ratio and "capture" characteristics of FM systems, including that of FIG. 1, but requiring only one-half the bandwidth of a comparable FM signal. The input signal at terminal 68 is $f_3(t)$ or $m_f \sin \omega_a t$, shown as a sinusoidal waveform 70, where $m_f$ is the modulation index. The output of the function generator 12 is now sin $[f_3(t)]$ or $f_4(t)$. This latter output signal is shown in the waveform 72 and is "folded back" upon itself within the constraints of the sine values ±1. The waveform 72 is the modulating signal coupled to a single sideband (SSB) transmitter 74. The transmitted signal may be received by an SSB receiver 76 with extraneous amplitude modulations caused by noise or interference. Therefore, the demodulated signal 78 may be $f_4(t) + n$, n=noise, rather than being identical to waveform 72. When the waveform 78 is "unfolded" in a function generator 80 which essentially derives the arc sine of the generator input signal, the output at a terminal 82 is the waveform 84 $f_3(t) + n$. Thus, as in angular modulation, the original waveform 70 has been restored with only a slight amount of noise, giving a signal-to-noise ratio improvement factor of $m_f$, and with the important advantage that one signal set of sidebands produces the same improvement over AM as does FM with the same modulation index and twice the bandwidth.

Figure 5:
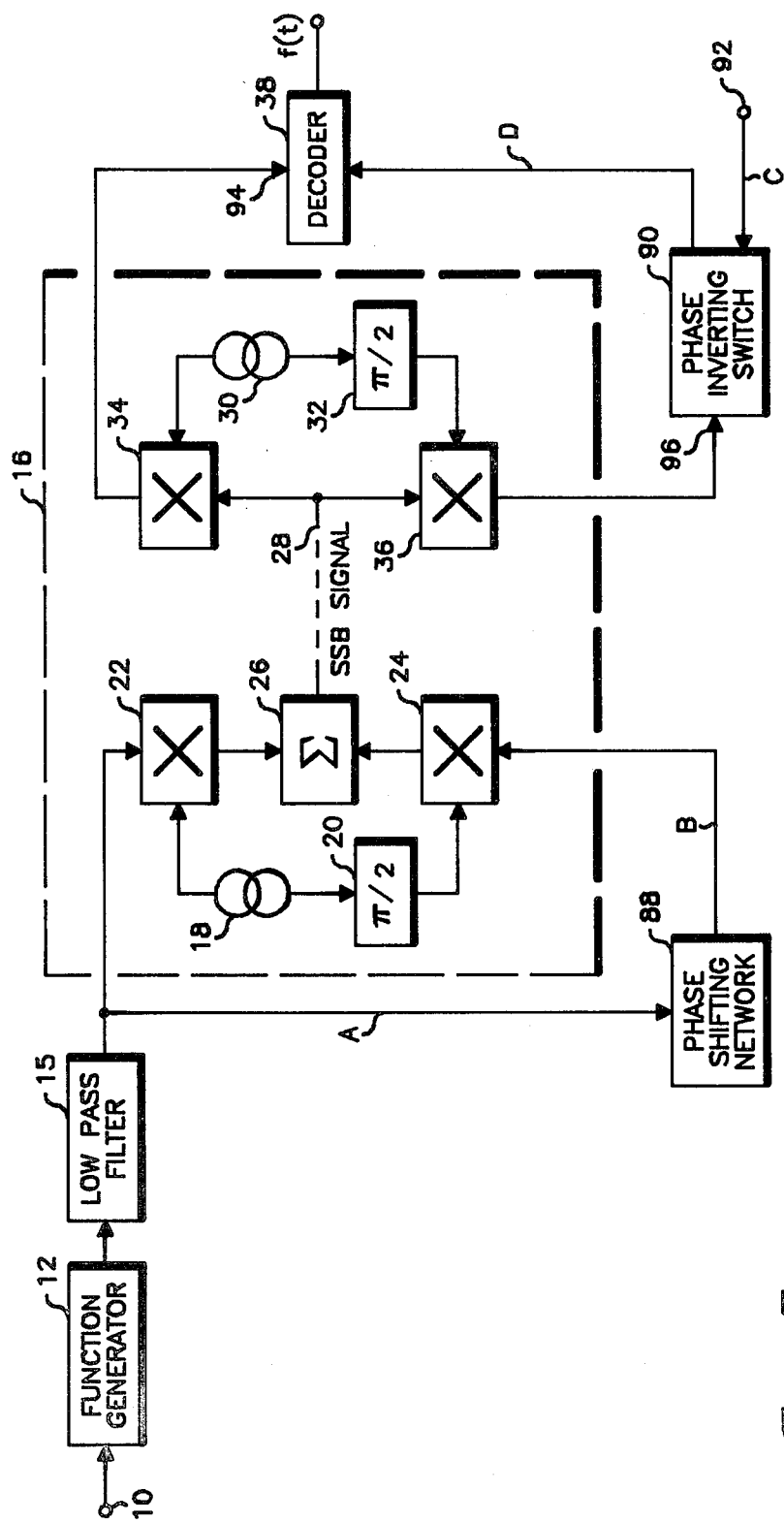
FIG. 5 is a more detailed diagram relating to FIG. 4.

The diagram of FIG. 5 shows many similarities to FIG. 1; i.e., an input signal f(t) at the terminal 10 is transformed in the function generator 12 to sin f(t), filtered in filter 15, and coupled to the system 16, and the sin f(t) output of the system 16 is coupled to the decoder 38. However, instead of coupling the signal f(t) to the second function generator 14 (as in FIG. 1), the sin f(t) output from function generator 12 is also coupled to a phase-shifting network 88 which is not frequency selective and which shifts the phase of each audio component by 90°, an operation known mathematically as taking the Hilbert transform of a signal. The output signal of the network 88 is then coupled to the multiplier 24, making the composite signal at the link 28 an SSB signal. This method of modulating a DSB-SC transmitter with the modulating signal on one input terminal and the Hilbert transform of the modulating signal on a second terminal is known as the phase-shift method of generating an SSB signal, thus the signal at link 28 is an SSB transmission of sin f(t) or TM. When the TM signal is demodulated in a quadrature detector, one output is sin f(t) and the other, from the multiplier 36 is the Hilbert transform of sin f(t). The output signal of the multiplier 36 is coupled to a phase-inverting switch 90, which is controlled by a control signal sgn [df(t)/dt] from a terminal 92, producing an output signal which is approximately cos f(t). The control signal will be discussed with respect to FIG. 7. As in FIG. 1, the sin f(t) and cos f(t) signals are processed in the decoder 38 to provide an output of f(t). In this circuit it would be desirable, as is known in the art, to send a small signal at the carrier frequency of source 18 through the link 28 for the purpose of synchronizing the source 30 by the usual phase locked means. This small amount of carrier can also be used for AGC as in AM-SSB.

In the waveforms of FIG. 6, line A represents sin f(t) where $f(t) = m_f \sin \omega_a t$, $\omega_a t$ is a single tone audio frequency and $m_f$ is the modulating index (10 radians in this example). The "folding" effect of the sine-of-the-sine function is apparent in line A. Line B represents the Hilbert transform of the signal of Line A. Line C is the signal at terminal 92 and may be expressed as sgn [df(t)/dt], representing ±1, depending on the sign of the given function. While line D is approximately cos f(t), the more accurate cos f(t) signal of line E is to be preferred, and a means of deriving line E will be shown in and described with respect to FIG. 8.

Figure 7:
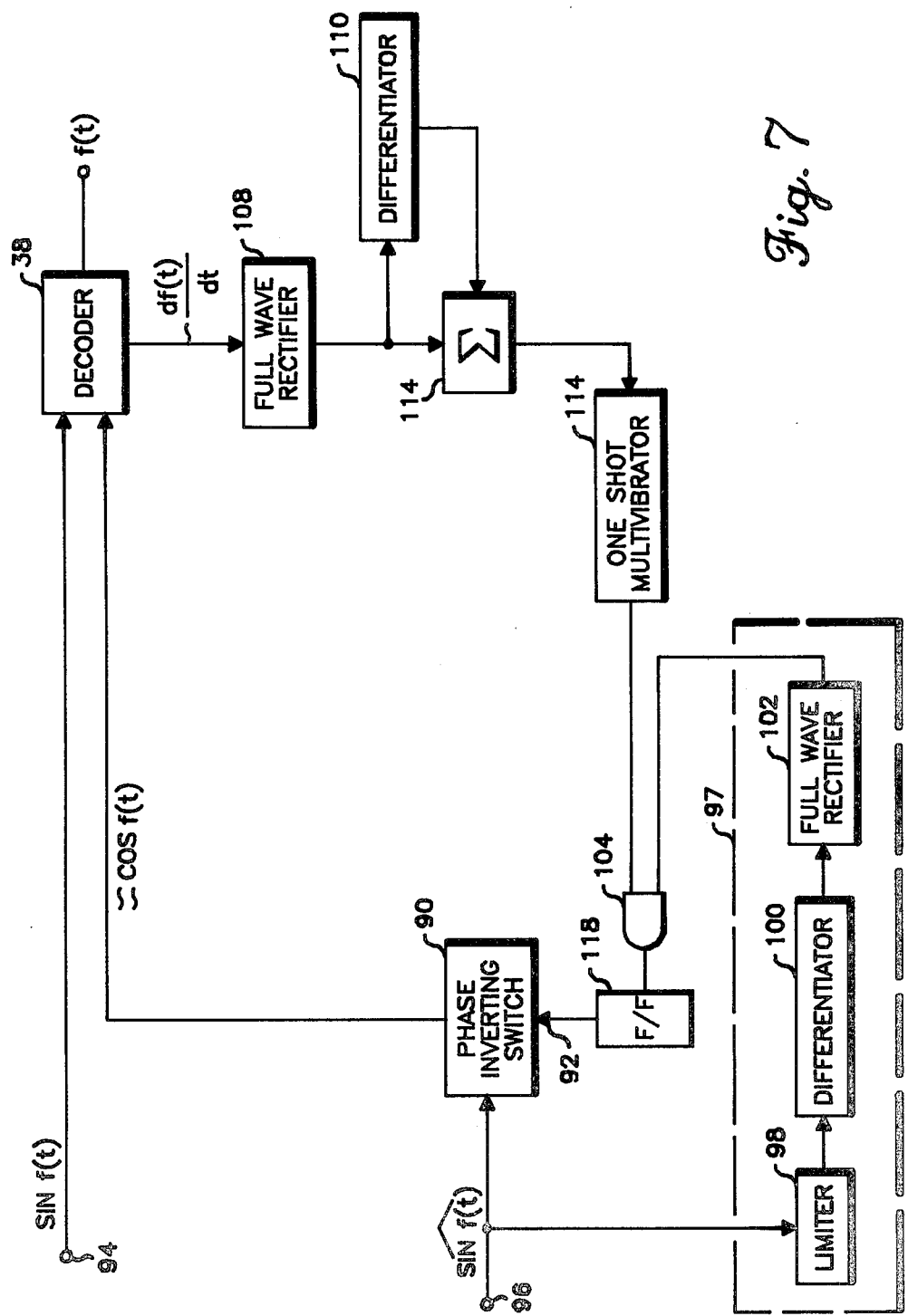
FIG. 7 is a block diagram of a portion of the diagram of FIG. 5 and includes a signum generator.

In FIG. 7, a terminal 94 couples the signal sin f(t) from the multiplier 34 to the decoder 38. A terminal 96 couples the Hilbert transform signal from multiplier 36 to the phase-inverting switch 90 and also to a zero crossing detector 97 comprising a limiter 98, a differentiator 100 and a full wave rectifier 102. The detector 97 detects the zero crossings of the signal at the terminal 96, and is coupled to one input of an AND gate 104. A terminal 106 of the decoder 38 provides a signal df(t)/dt to a full wave rectifier 108. The rectified output is coupled to a differentiator 110 and to an adder 112 which has a second input from the differentiator 110. The combined output of the adder 112 thus includes small positive pulses which precede the zero crossings of the signal from the terminal 106. These positive pulses trigger a one-shot multivibrator 114, the output of which is coupled to a second input of the AND gate 104. The output of the AND gate then represents only those zero crossings in the output of the detector 97 which coincide closely with the zero crossings of the signal at terminal 106. A combination of elements which include or serve the same purpose as the rectifier 108, the differentiator 110, the adder 112 and the multivibrator 114 may be termed a "zero crossing predictor circuit". The coincident crossings are shown within the windows 116 indicated in line B of FIG. 6. The AND gate output triggers a flip-flop 118 which provides the signal of line C of FIG. 6.

Figure 8:
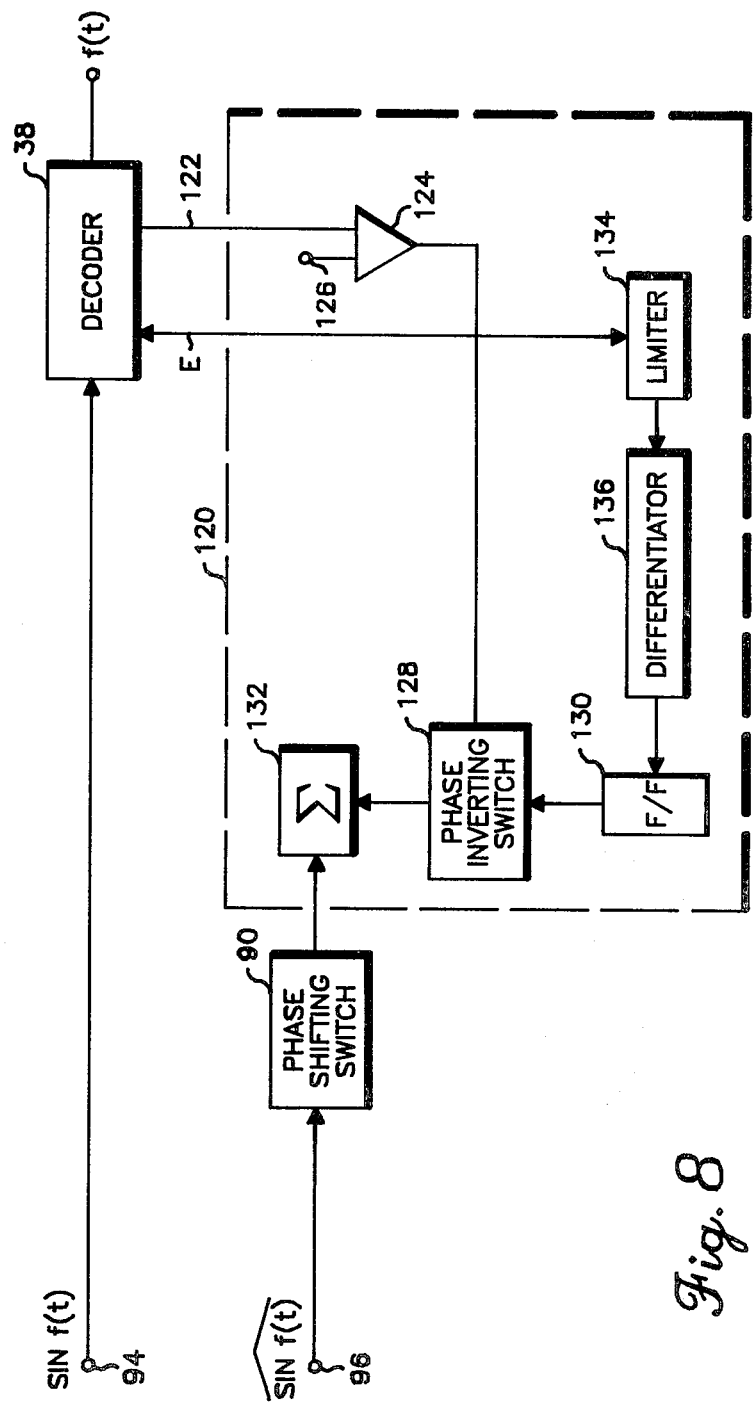
FIG. 8 is a block diagram of an additional element to be used with FIG. 7.

If FIG. 8, a coherence circuit 120 has been added between the phase-inverting switch 90 and the decoder 38 (FIG. 7) to prevent the output signal of the switch 90 from approaching zero at the same time the signal at terminal 94 goes to zero, since this event would cause the decoder 38 to lose coherence and produce a large burst of noise. An output terminal 122 of decoder 38 provides a signal $(I^2 + Q^2)$ to a comparator 124 having a reference terminal 126. The comparator output is coupled to a phase-inverting switch 128 which is controlled by a signal (sgn [cos f(t)]) from a F/F 130. The signal from the phase-inverting switch 90 is combined with the output of the phase-inverting switch 128 in an adder 132, the output of which is essentially cos f(t) as seen in FIG. 6E. The adder output is coupled to decoder 38 and, through a limiter 134 and a differentiator 136, to the F/F 130, providing a signal sgn [cos f(t)] which controls the switch 128. When the signals at terminals 94 and 96 both approach zero, the comparator 124, through the switch 128, provides a signal which brings the cos f(t) signal to the proper polarity. In this circuit the small carrier signal referred to with respect to FIG. 5 can also be rectified and amplified to provide the reference voltage at terminal 126 of the comparator 124. With this type of reference voltage, the receiver can determine when there is no transmission, and squelch as necessary.

Thus, there has been shown and described a new system of modulation which can provide all of the desirable characteristics of both AM and FM with minimum bandwidth requirements, and a new way of providing standard FM. A signum signal circuit for use in such a system has been disclosed and claimed. Other modifications and variations are possible, and it is intended to cover all such as fall within the spirit and scope of the appended claims.

What is claimed is:

1. A signum circuit for deriving a signal sgn (df(t)/dt) where f(t) is an information signal and comprising: first input means for receiving a first input signal of the form sin f(t);

second input means for receiving a second input signal which is the Hilbert transform of sin f(t);

decoder means for providing f(t) at a first output and df(t)/dt at a second output and having a first input coupled to the first input means;

zero crossing detector means coupled to the second input means for detecting all zero crossings in the second input signal;

zero crossing predictor means coupled to the decoder means for predicting each zero crossing in the second decoder output signal;

selector means coupled to the detector means and the predictor means for selecting those detected zero crossings which essentially coincide with the predicted zero crossings; and means coupled to the second input means and to the selector means for reversing the phase to the second input signal in response to the output of the selector means, and wherein the output of the phase reversing means is coupled to a second input of the decoder means.

2. A signum circuit according to claim 1 and wherein the zero crossing detector means comprises limiter means for limiting the amplitude of the second input signal, differentiator means for differentiating the limited signal and rectifier means for rectifying the differentiated signal.

3. A signum circuit according to claim 1 and wherein the zero crossing predictor means comprises rectifier means coupled to rectify the second decoder output signal, differentiator means for differentiating the rectified signal and adder means coupled to combine the rectified signal and the differentiated signal.

4. A signum circuit according to claim 3 and further including multivibrator means coupled to be triggered by the combined signal.

5. A signum circuit according to claim 1 and wherein the selector means includes logic means for providing AND multiplication.

6. A signum circuit according to claim 5 and wherein the selector means further includes a bistable circuit coupled to be triggered by the logic means output signal.

* * * * *